(12) United States Patent
Woo

(10) Patent No.: US 7,375,681 B1
(45) Date of Patent: May 20, 2008

(54) HARDWARE CURVE FLATTENING OF CRYSTAL OSCILLATOR TEMPERATURE DRIFT FOLLOWED BY SOFTWARE COMPENSATION FOR RESIDUAL OFFSET

(76) Inventor: Arthur N. Woo, 21577 Villa Maria Ct., Cupertino, CA (US) 95014

( * ) Notice: Subject to any disclaimer, the term of this patent is extended or adjusted under 35 U.S.C. 154(b) by 143 days.

(21) Appl. No.: 11/217,915

(22) Filed: Sep. 1, 2005

(51) Int. Cl.
*G01S 1/00* (2006.01)
(52) U.S. Cl. ................................. 342/357.02
(58) Field of Classification Search .......... 342/357.02, 342/357.12; 455/255–265
See application file for complete search history.

(56) References Cited

U.S. PATENT DOCUMENTS

| | | | |
|---|---|---|---|
| 5,629,708 A * | 5/1997 | Rodal et al. | 342/357.15 |
| 6,509,870 B1 | 1/2003 | Matsushita et al. | |
| 7,010,307 B2 * | 3/2006 | Abraham | 455/456.1 |

* cited by examiner

*Primary Examiner*—Thomas H. Tarcza
*Assistant Examiner*—Nga X Nguyen
(74) *Attorney, Agent, or Firm*—Law Offices of Thomas E. Schatzel

(57) ABSTRACT

A method for correcting frequency errors in the local reference frequency crystal oscillator of a GPS receiver begins with a step in which the ordinary temperature response of a crystal is characterized. A hardware circuit is incorporated with that crystal to mirror that same characteristic. A temperature sensor is used to control a compensation applied. The combination outputs a fairly flat temperature response, e.g., near zero delta-frequency change over the operating temperature range. But this flat response has an unknown offset from the true frequency. A next step finds a precision timing reference, such as when the receiver locks onto and tracks GPS satellites. The receiver then knows time precisely and a navigation software can compute the offset accurately. A value is stored for that offset in memory. Such value is thereafter recalled at each cold start and is used by software to remove the expected frequency offset.

4 Claims, 3 Drawing Sheets

US 7,375,681 B1

HARDWARE CURVE FLATTENING OF CRYSTAL OSCILLATOR TEMPERATURE DRIFT FOLLOWED BY SOFTWARE COMPENSATION FOR RESIDUAL OFFSET

FIELD OF THE INVENTION

The present invention relates to navigation satellite receivers, and more particularly to methods and systems for improving the time-to-first-fix (TTFF) by reducing the frequency uncertainty associated with local crystal oscillators.

DESCRIPTION OF THE PRIOR ART

Commercial oscillator crystals are available with frequency stabilities on the order of one-part-per-million (1-ppm) to 100-ppm. In the past, this was considered good in most receiver local oscillator applications. But global positioning system (GPS) receivers need local reference oscillator frequency stabilities that are much better then 1-ppm. Crystals are particularly sensitive to their operating temperatures, so temperature variations cause a major source of frequency error in GPS receivers.

When a GPS receiver comes up from a cold start, it must begin a frequency search to find GPS satellite transmissions. Relatively large frequency uncertainties can result from local reference oscillator crystal errors. Prior art GPS receivers have resorted to using highly accurate crystals, but these can be very costly. One conventional approach has been to place the crystals in ovens that keep their temperatures constant during use.

During GPS receiver manufacture, a temperature "sweep" of the individual crystal can be made while logging the oscillation frequency at each temperature point. These readings are used later in post processing to back out the temperature induced frequency uncertainties. Once this characteristic curve or model has been ascertained at the factory, a software correction (SCXO) model is locked into the GPS receiver and does not change. For example, a conventional SCXO is described by Lawrence Hoff, et al., in U.S. Pat. No. 6,420,938, issued Jul. 16, 2002.

Commercially marketed crystals are batch characterized by their manufacturers and guaranteed to have a temperature-frequency characteristic that falls within certain limits. Frequency stability is normally specified as a frequency tolerance over a defined operating temperature range with respect to the frequency at reference temperature. The temperature ranges are defined for each crystal in the relevant data sheet. For example, a typical frequency tolerance for an AT-cut crystal operating in the 15.0 MHz to 30.0 MHz range is 25° C.±2° C. The frequency stability for such is published as being ±5 ppm for 0° C. to 50° C., ±5 ppm for −10° C. to 60° C., ±10 ppm for −20° to 70° C., ±20 ppm for −30° C. to 80° C., ±25 ppm for −40° C. to 90° C., ±50 ppm for −55° C. to 105° C., and ±50 ppm for −55° to 125° C. Typical aging is ±3 ppm per year, so the baseline can shift over time and have an offset at the nominal temperature of 25° C.

During manufacturing quality assurance tests, units that fall outside these published parameters are culled out. Such characteristic curves are generally in the form of an "S" laying on its side, and the middle point of the curve can be essentially flat in its delta-frequency to delta-temperature changes. The angle of cut of the quartz blank from its quartz stone determines which curve will be followed. The chosen angle is subject to its own tolerance. Since manufacturing cost is tolerance-dependent, it is best not to specify a wider operating temperature range then is actually needed unless some sacrifice of stability, or an increase in cost, can be accepted. One significant frequency error that occurs often is a baseline shift of such "S" curve up or down in frequency. Removing such baseline shift from the overall frequency uncertainty can result in an order of magnitude improvement.

But, herein lies a problem in practice. The characterization of each crystal in each manufactured unit is costly and time consuming because a representative group of operating temperatures must be visited during the factory calibration. It would be better if all the errors could be removed at a single temperature and without having to temperature cycle the unit for calibration.

SUMMARY OF THE INVENTION

Briefly, a method embodiment of the present invention providing for the correcting of frequency errors in a local reference frequency crystal oscillator of a GPS receiver begins with a step in which the ordinary temperature response of a crystal is characterized. A hardware circuit is incorporated with that crystal to mirror that same characteristic. A temperature sensor is used to control a compensation applied. The combination outputs a fairly flat temperature response, e.g., near zero delta-frequency change over the operating temperature range. But this flat response has an unknown offset from the true frequency. A next step finds a precision timing reference, such as when the receiver locks onto and tracks GPS satellites. The receiver then knows time precisely and a navigation software can compute the offset accurately. A value is stored for that offset in memory. Such value is thereafter recalled at each cold start and is used by software to remove the expected frequency offset.

An advantage of the present invention is that a GPS receiver and method are provided that improves the time required to produce a first position fix.

Another advantage of the present invention is that a GPS receiver and method are provided for relaxing the frequency stability limits of crystals that can be used in commercial products, and thereby reduce manufacturing costs.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENT

Figure 1:
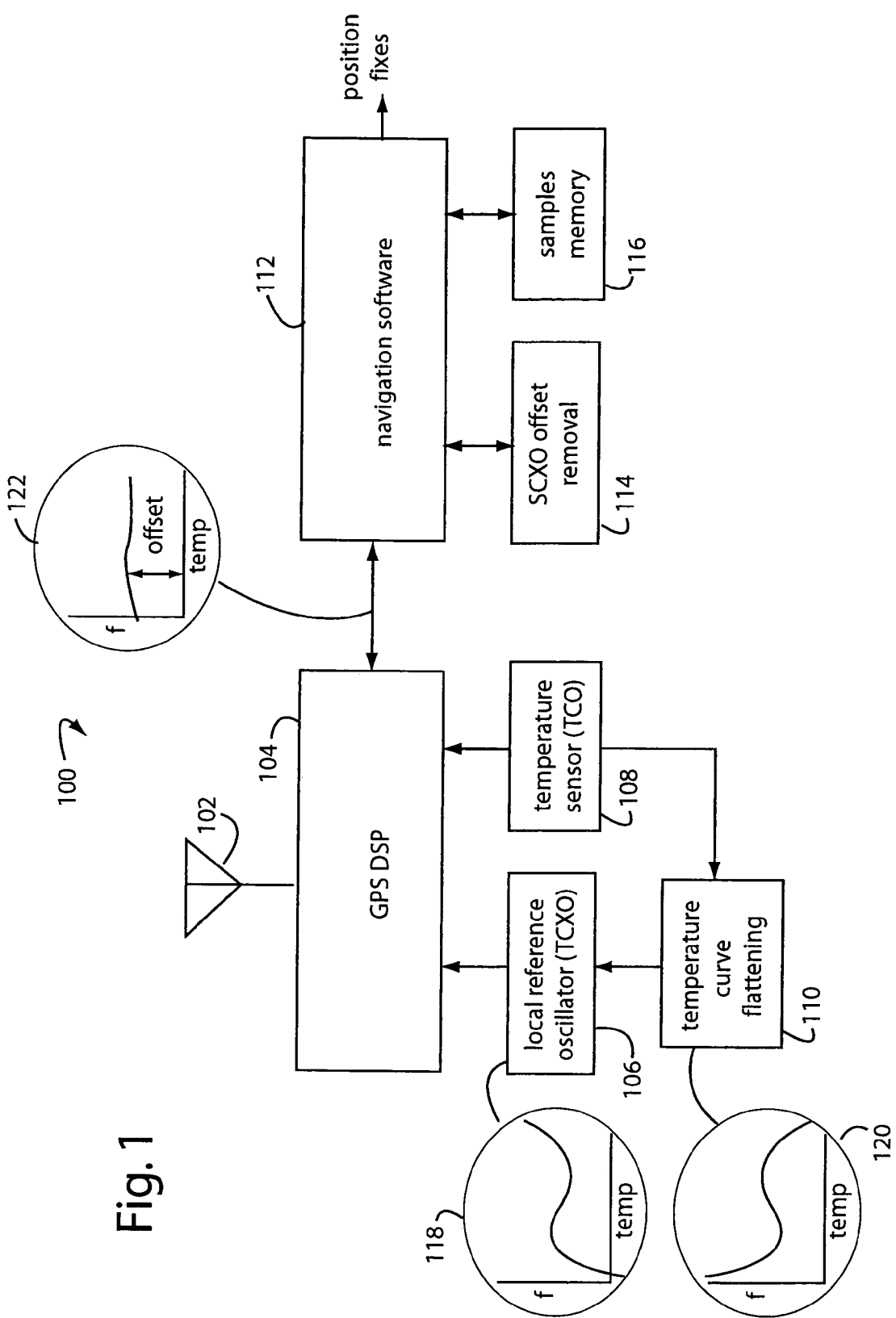
FIG. 1 is a functional block diagram of a GPS receiver embodiment of the present invention.

FIG. 1 illustrates a GPS receiver embodiment of the present invention, and is referred to herein by the general reference numeral 100. The GPS receiver 100 comprises an antenna 102 to receive the microwave transmissions of orbiting GPS satellites, and a GPS RF and digital signal processor (RF-DSP) 104 to tune and demodulate these signals. A local reference oscillator 106 includes a temperature compensated crystal oscillator (TCXO). Its temperature is measured by a temperature sensor 108, e.g., a temperature controlled oscillator (TCO) that outputs a frequency proportional to environmental temperature. A hardware implemented circuit 110 is used to frequency compensate the TCXO 106 by flattening out its characteristic curve. It operates by generating an opposite temperature characteristic to that expected for the particular TCXO being used or its manufacturers specifications. During manufacture of the receiver 100, it is critical that this circuit need no further adjustment.

A navigation software 112 interacts with the GPS DSP 104 to find the carrier frequencies of the GPS satellite transmissions, and to demodulate and correlate navigation information to produce user position fixes and to lock onto the GPS system time. Once that occurs, the GPS receiver 100 has available very precise time and frequency information, and such can be used to accurately gauge the frequency error of TCXO 106. An SCXO offset remover 114 is used to thereafter remove any residual flat offset remaining. The offset samples to use are stored in a samples memory 116 and consulted on subsequent startups.

In GPS receiver 100, the quality of the estimate of the true frequency generated by TCXO oscillator 106 directly affects the time-to-first-fix (TTFF), e.g., the delay from a cold start to the outputting of a first user position fix. This is because a frequency search must allow for both Doppler shift uncertainties and local reference oscillator error. Using the software model (SCXO) offset remover 114 can help improve performance, and low-cost TCXO oscillators 106 can be used where they could not be tolerated before.

In operation, the TCXO 106 will tend to generate a temperature dependent characteristic 118. This is exactly countered by circuit 110 generating an opposite curve 120. The two cancel and result in an essentially flat temperature curve 122. Only an offset remains, and this error is essentially constant with temperature. Therefore, a calibration obtained at any operating temperature will be effective for all operating temperatures. The job of SCXO offset remover 114 is therefore quite simple.

In embodiments of the present invention, the SCXO model 114 helps provide estimates of the local oscillator's drift during power-up and before a first user position fix. The drift is frequency error of local oscillator from its nominal frequency, e.g., drift=f-f0, where $f_0$ is nominal frequency of the crystal oscillator and f is the actual frequency generated by the crystal oscillator. Drift is generally a function of temperature. Such actual frequency f can only be determined after the GPS receiver is locked onto the GPS system time. But an estimate of f is needed in order to get the GPS receiver to lock in the first place. Improving the estimate of this frequency means a smaller uncertainty (sigma). A smaller sigma reduces the time needed to tune to the GPS satellite transmissions because less frequency spectrum has to be searched.

Temperature-compensated crystal oscillators (TCXO) have a static offset in addition to their temperature-related instability. Such static offset is usually expressed in manufacturer's datasheets as a frequency offset from a nominal frequency at some reference temperature, e.g., 1 ppm@25° C. A second major source of frequency error is dynamic-temperature dependent error, which is also specified for the batch or product series by the manufacturer.

In order to determine the offset 122, the GPS receiver 100 has to first acquire a position-fix. During such times it will have a very accurate frequency reference, the GPS system time. Such reference is then used to compute the actual frequency of the local reference oscillator TCXO 106. To track GPS signals, the GPS receiver 100 computes the offset from its oscillator nominal frequency $f_0$ and then uses it to track GPS signal from satellites. This means, that at any time when GPS receiver computes position fix, it also has very exact information about its crystal frequency offset.

Figure 2:
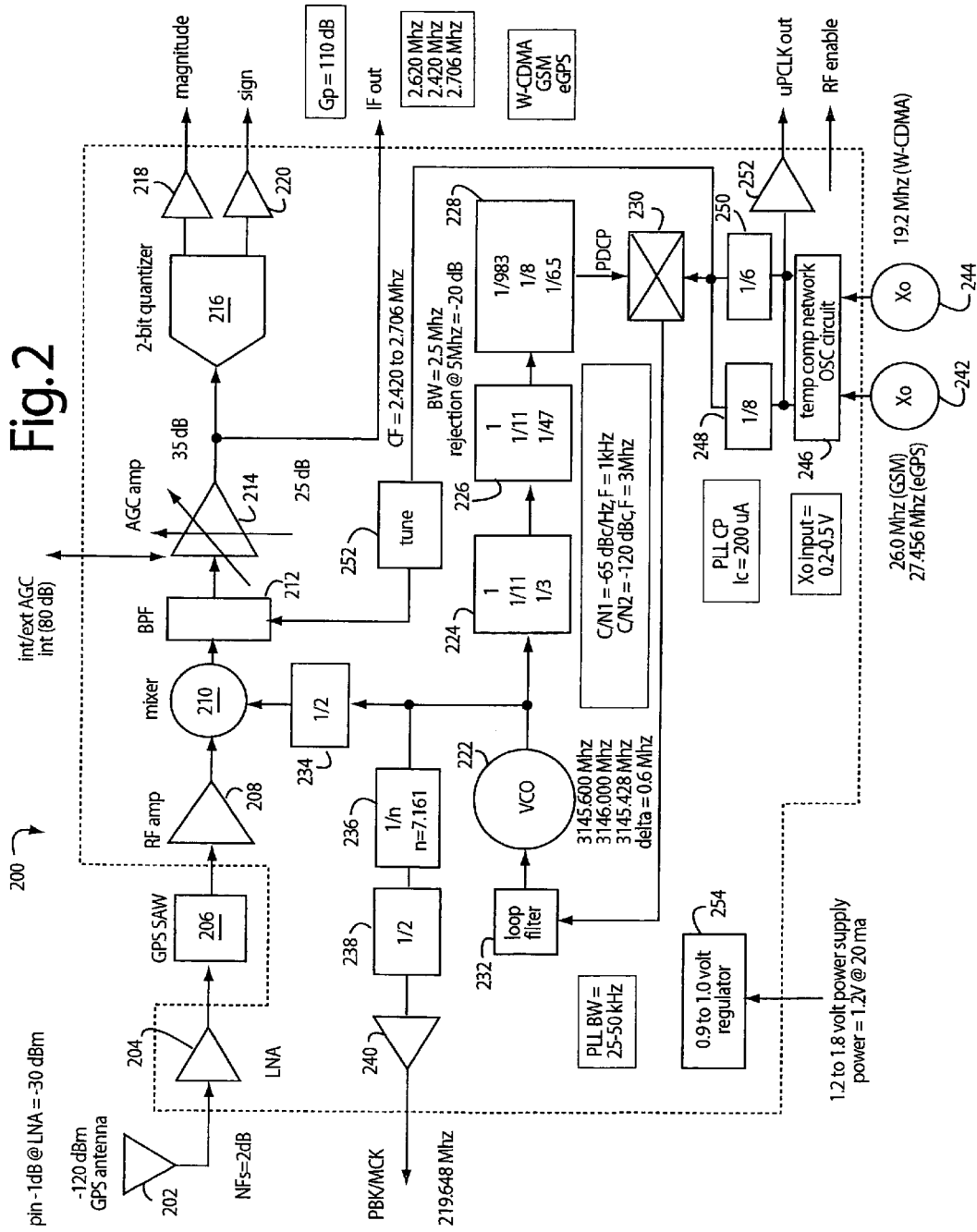
FIG. 2 is a functional block diagram of an implementation of the digital signal processor GPS chip in the receiver of FIG. 1.

FIG. 2 represents a GPS RF and digital signal processor (RF-DSP) chip embodiment of the present invention, and is referred to herein by the general reference numeral 200. The GPS RF-DSP chip 200 comprises an on-chip antenna 202 with a high output impedance that matches the high input impedance of a CMOS technology low noise amplifier (LNA) 204. An arbitrary 50-ohm impedance is not used because a matching network that generates noise would be needed between the antenna 202 and LNA 204. In fact, the match between antenna 202 and LNA 204 is not adjusted for best impedance match, and therefore maximum power transfer, but rather best noise match. An RF bandpass filter (GPS-SAW) 206 precedes an RF amplifier 208. An intermediate frequency (IF) is generated by a mixer 210 that receives a synthesized local oscillator (LO) frequency. A tunable IF filter (BPF) 212 removes the mixer images. The downconverted baseband is amplified by an automatic gain control (AGC) stage 214. A 2-bit quantizer 216 produces magnitude and sign digital samples that are output by buffers 218 and 220.

A voltage controlled oscillator 222 is used in a phase locked loop (PLL) to synthesize a variety of operating frequencies. Different frequency plans are implemented by programmable dividers 224, 226, and 228. A phase detector 230 compares the final division to a crystal generated reference frequency. A feedback difference control signal is returned through a loop filter 232 to keep VCO 222 on frequency. A divider 234 provides a final LO frequency to mixer 210. Master (MCK) and other (PBK) clocks are derived from the VCO 222 by dividers 236 and 238, and output buffer 240. A first crystal oscillator (Xo) 242 and a second crystal oscillator (Xo) 244 are hardware temperature-compensated by a network 246. Such corresponds to temperature curve flattening circuit 110 in FIG. 1. Selectable dividers 248 and 250 provide a choice in crystal reference frequency. Such is used by tuner 252 to operate BPF 212. A voltage regulator 254 provides for the correct rail voltage for a CMOS chip with sub-0.20 micrometer geometry, e.g., about one volt. The all-CMOS design allows both the RF and DSP sections to be implemented on the same semiconductor chip.

Figure 3:
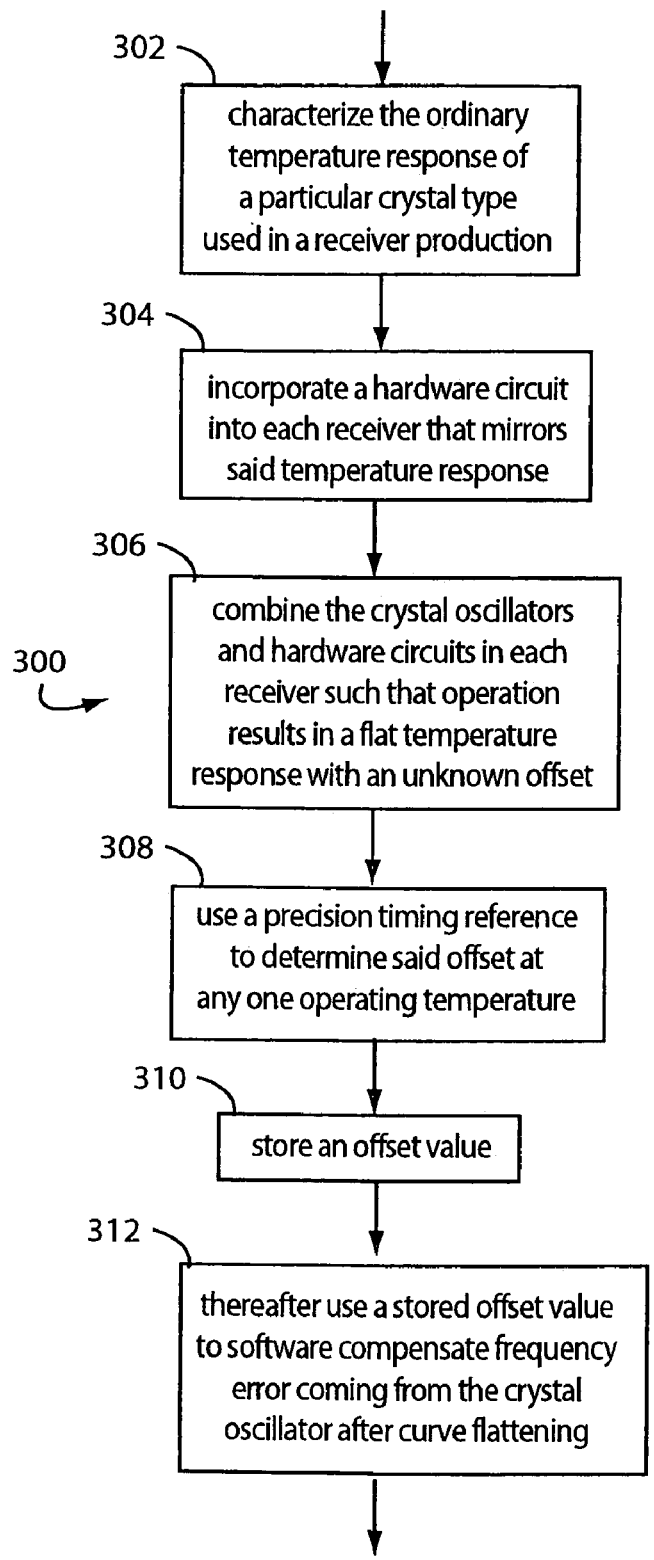
FIG. 3 is a flowchart diagram of a method embodiment of the present invention for initializing the GPS receiver of FIG. 1 with a flat SCXO model.

FIG. 3 represents a method embodiment of the present invention, and is referred to herein by the general reference numeral 300. The method 300 begins with a step 302 in which the ordinary temperature response of a crystal is characterized. A step 304 incorporates a hardware circuit with that crystal that mirrors that same characteristic. A temperature sensor is used to control the compensation applied, e.g., sensor 108 in FIG. 1. In a step 306, the two are combined such that the combination outputs a fairly flat temperature response, e.g., near zero delta-frequency change over the operating temperature range. But this flat response has an unknown offset from the true frequency. A step 308 finds a precision timing reference, such as when the receiver 100 locks onto and tracks GPS satellites. It then knows time precisely and the navigation software 112 can compute the offset accurately. A step 310 stores a value for that offset in memory. A step 312 is thereafter repeated at each cold start, and the stored temperature offset is used by software 112 to remove the expected frequency offset by software correction in SCXO 114.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the scope of the invention.

What is claimed is:

1. A global positioning system (GPS) receiver method for improving time-to-first-fix performance, comprising:

before being installed for use in a navigation radio receiver as a reference local oscillator, characterizing the ordinary frequency versus temperature response of a crystal over its operating temperature range, wherein any deviations from a nominal frequency, but not a single average offset of said nominal frequency from a true frequency are modeled by a characteristic curve;

during operation, using an electronic temperature-correction circuit with an opposite characteristic curve to said characteristic curve modeled for said crystal to in a hardware-only combination with said crystal oscillator to continually produce a substantially flat temperature response of near zero delta-frequency change over said operating temperature range, but such flat response has an unknown single offset from a true frequency;

if a calculation of crystal offset frequency error is available, storing in memory a value representing such said single offset from a true frequency;

using a reference frequency with said near zero delta-frequency change over said operating temperature range produced by said combination of said local reference oscillator and said electronic temperature-correction circuit in a GPS digital signal processor to acquire and track GPS satellite transmissions in spite of there being an unknown single offset from a true frequency in said reference local oscillator;

during operation, in navigation software position fix calculations to initially acquire and track GPS satellite transmissions, removing in software said single offset from a true frequency by fetching and using said value stored in said memory, wherein initial carrier frequency uncertainty is reduced;

after acquiring and tracking GPS satellite transmissions, deriving a precision timing reference that is used to calculate said unknown single offset from a true frequency in said reference local oscillator, and storing a value in said memory to represent said calculation of crystal offset frequency error; and thereafter recalling at each cold start said stored value and using it in software to remove an expected frequency offset.

2. A method of crystal oscillator temperature-frequency error correction, comprising:

flattening a characteristic S-curve of delta-frequency error of a crystal oscillator modeled over an operating temperature range solely with an electronic hardware circuit guided by a collocated temperature sensor; and using a GPS navigation receiver for removing a single flat-over-temperature delta-frequency error for an entire operating temperature range from an output of the previous step with a computer software that processes digitized samples of downconverted GPS radio transmissions.

3. An improved GPS receiver, having a radio frequency stage for down-converting transmissions to digitized samples which are then demodulated by a GPS navigation software;

a crystal local oscillator that has a previously modeled characteristic variation at its output frequency that depends on its operating temperature;

a temperature sensor to measure said operating temperature;

the improvement comprising:

an electronic temperature curve flattening circuit connected to the crystal local oscillator that actually eliminates said characteristic variation according to a measurement it obtains from said temperature sensor, and that leaves an actual single offset from a true frequency that spans the entire operating temperature; and a GPS navigation software program connected to process said digitized samples and to virtually remove said offset from a true frequency according to a value calculated and stored in a previous acquisition and tracking that provided a precision timing reference.

4. The GPS receiver of claim 3, wherein said value is consulted by the GPS navigation software program at receiver initialization to begin a carrier frequency search.

* * * * *